United States Patent [19]

Obara

[11] Patent Number: 4,680,482
[45] Date of Patent: Jul. 14, 1987

[54] INVERTER FOR USE IN BINARY COUNTER
[75] Inventor: Takashi Obara, Tokyo, Japan
[73] Assignee: NEC Corporation, Tokyo, Japan
[21] Appl. No.: 886,156
[22] Filed: Jul. 16, 1986
[30] Foreign Application Priority Data Jul. 16, 1985 [JP] Japan ............................. 60-157414

[51] Int. Cl.⁴ .......................................... H03K 3/356
[52] U.S. Cl. .................................. 307/279; 307/453; 307/468; 307/246; 307/262; 377/41
[58] Field of Search ............... 307/443, 448, 453, 465, 307/468, 481, 353, 246, 584, 262, 279, 291; 377/41, 55–56

[56] References Cited

U.S. PATENT DOCUMENTS

| 3,558,475 | 6/1971 | Scott | 377/41 |
|---|---|---|---|
| 4,066,874 | 1/1978 | Shaw | 377/41 |
| 4,181,862 | 1/1980 | Dingwall | 307/279 X |
| 4,361,769 | 11/1982 | Hatchett et al. | 307/353 |
| 4,414,547 | 11/1983 | Knapp et al. | 307/465 X |
| 4,442,365 | 4/1984 | Nagami | 307/443 X |
| 4,486,851 | 12/1984 | Christopher et al. | 377/55 X |
| 4,539,495 | 9/1985 | Demler | 307/246 X |
| 4,634,890 | 1/1987 | Lee | 307/443 X |

OTHER PUBLICATIONS

Houdek, "Complementing Up–Down Counter", IBM T.D.B., vol. 13, No. 1, Jun. 1970, p. 290.

Schuster, "JK Latch Using Capacitor Store", IBM T.D.B., vol. 17, No. 6, Nov. 1974, pp. 1824–1825.
Lee, "Race-Free Level Sensitive Master-Slave Latch Utilizing A Single Phase Clock", IBM T. D. B., vol. 20, No. 1, Jun. 1977, pp. 263–264.

Primary Examiner—Stanley D. Miller
Assistant Examiner—D. R. Hudspeth
Attorney, Agent, or Firm—Sughrue, Mion, Zinn, Macpeak, and Seas

[57] ABSTRACT

An inverter for use in a binary counter comprises a flip-flop having first and second input/output nodes respectively applied with input signals of opposite polarities, a first field effect transistor having a source-drain path connected between the first input/output node and a third node and a gate connected to receive a control clock signal, and a capacitor connected to the third node so as to hold the potential on the first input-/output node when the first transistor is turned on. Further, there is provided a switch circuit connected between a supply voltage and a ground and having a first input connected to the third node, a second input connected to receive an inversion control signal, and an output connected to the first input/output node. This switch circuit is responsive to the inversion control signal so as to bring its output to a voltage condition opposite to that held in the capacitor.

11 Claims, 4 Drawing Figures

INVERTER FOR USE IN BINARY COUNTER

BACKGROUND OF THE INVENTION

1. Field of the Invention

The present invention relates to a binary counter which can be assembled or incorporated in the form of a semiconductor integrated circuit, and more particularly to an inverter for use in a binary counter constituted of insulated gate field effect transistors in a semiconductor integrated circuit.

2. Description of Related Art

In dynamic memories formed of insulated gate field effect transistors such as metal-oxide-semiconductor (MOS) transistors, a binary counter has been required for an internal refresh operation because it needs address increment or address decrement. Typically, the binary counter is a synchronous binary counter driven by first and second clocks for precharge and activation, respectively. Conventionally, this synchronous binary counter mainly includes an inverter adapted to generate a binary counter signal, and a carry signal generator for inverting the condition of the inverter. This inverter includes a first flip-flop for outputting the binary counter signal and a second flip-flop for latching the output data in a previous cycle.

On the other hand, for address increment or decrement in the refresh of the dynamic memory, there are needed binary counters of the same number as the bit number of an address output signal. However, if there are used the conventional binary counters incorporating a pair of flip-flops in each inverter section, since the inverters need a large number of transistors, the dynamic memory chip inevitably becomes large.

SUMMARY OF THE INVENTION

Accordingly, it is an object of the present invention to provide an inverter for use in a binary counter, which has overcome the above mentioned disadvantages of the conventional inverter.

Another object of the present invention is to provide an inverter which can be used for a binary counter for refreshing a dynamic memory and which is constituted of a relatively small number of elements.

Still another object of the present invention is to provide an inverter for use in a binary counter, which includes a simple circuit for retaining a previous cycle data.

A further object of the present invention is to provide an inverter for use in a binary counter, in which a precharge and a pull-down are performed by a common circuit.

The above and other objects of the present invention are achieved in accordance with the present invention by an inverter for use in a binary counter comprising a flip-flop having first and second input/output nodes respectively applied with input signals of opposite polarities, first switch means connected between the first input/output node and a third node and turned on and off in response to a control clock signal, charge storage means connected to the third node so as to hold the potential on the first input/output node when the first switch means is turned on, and switch circuit means connected between a supply voltage and a ground and having a first input connected to the third node, a second input connected to receive an inversion control signal, and an output connected to the first input/output node, the switch circuit means being responsive to the inversion control signal so as to bring its output to a voltage condition opposite to that held in the charge storage means.

With the above arrangement, if a high level signal and a low level signal are applied to the first and second input/output nodes, respectively, the flip-flop is set to the condition that the first and second nodes assume a high potential and a low potential, respectively. In this condition, if the first switch means is turned on in response to a control clock signal, the charge storage means is charged so that the third node is brought into a high potential. As a result, when an inversion control signal is applied to the switch circuit means, it operates to bring the output of the switch circuit means and hence the first input/output node to a low potential which is opposite to the potential condition held in the charge storage means and hence the condition of the flip-flop in a just previous cycle.

As seen from the above, the previous cycle data is stored or latched by the charge storage means, not by a flip-flop used in the conventional inverter. Therefore, the inverter can be constituted of relatively small number of elements. The condition of the flip-flop is inverted by pulling down a high level input/output node of the flip-flop. Namely, the output nodes are pulled down, but are not pulled up, and therefore, no pull-up circuit is not required. In this point, the number of elements can be reduced. In addition, the precharge of the charge storage means and the pull-down of the output nodes are controlled by the control clock signal and the inversion control signal. Thus, no two-phase signal is not needed, and so, the inverter can be driven by a small number of control signals. Namely, the inverter is a static inverter.

In one embodiment of the inverter in accordance with the present invention, the charge storage means is a capacitor connected between the third node and the ground. In addition, the switch circuit means includes a second switch means connected between the ground and a fourth node and turned on and off in accordance with the potential held in the charge storage means, a third switch means connected between the fourth node and the supply voltage and turned on and off in accordance with the inversion control signal, and a fourth switch means connected between the first input/output node and the fourth node and turned on and off in accordance with the inversion control signal to assume the same condition as that of the third switch means. With this structure, for example, when the first input/output node is brought into a high potential and the first switch means is turned on, the third node is brought into a high potential so as to turn on the second switch means. As a result, when the third and fourth switch means are turned on in response to the inversion control signal, the first input/output node is brought into a low potential.

More specifically, the first switch means is a first field effect transistor having a source-drain path connected between the first input/output node and the third node, and the gate of the first transistor is connected to receive the control clock signal. The second switch means is a second field effect transistor having a gate connected to the third node and a source-drain path connected between the fourth node and the ground. The third switch means is a third field effect transistor having a gate receiving the inversion control signal and a source-drain path connected between the supply voltage and the fourth node. The fourth switch means is a fourth field effect transistor having a gate receiving the inversion control signal and a source-drain path connected between the fourth node and the first input/output node.

In a preferred embodiment, an inverter for use in a binary counter comprises a flip-flop having first and second input/output nodes respectively applied with input signals of opposite polarities, a first switch means connected between the first input/output node and a third node and turned on and off in response to a control clock signal, a first capacitor connected to the third node so as to hold the potential on the first input/output node when the first switch means is turned on, a second switch means connected between the second input/output node and a fourth node and turned on and off in response to the control clock signal, a second capacitor connected to the fourth node so as to hold the potential on the second input/output node when the second switch means is turned on, a third switch means connected between the ground and a fifth node and turned on and off in accordance with the potential held in the first capacitor, a fourth switch means connected between the fifth node and the supply voltage and turned on and off in accordance with the inversion control signal, and a fifth switch means connected between the first input/output node and the fifth node and turned on and off in accordance with the inversion control signal to assume the same condition as that of the fourth switch means, a sixth switch means connected between the ground and a sixth node and turned on and off in accordance with the potential held in the second capacitor, a seventh switch means connected between the sixth node and the supply voltage and turned on and off in accordance with the inversion control signal, and an eighth switch means connected between the second input/output node and the sixth node and turned on and off in accordance with the inversion control signal to assume the same condition as that of the seventh switch means.

With this structure, in the condition that the first and second input/output nodes of the flip-flop are brought into a high potential and a low potential, respectively, when the first and second switch means are turned on in response to a predetermined control clock signal, the third and fourth nodes are brought into high and low potentials, respectively so as to put the third and sixth switch means in on condition and in off condition, respectively. Thereafter, when the fourth, fifth, seventh and eighth switch means are turned on in response to the inversion control signal, the first and second input/output nodes are inverted into a low potential and a high potential, respectively.

The above and other objects, features and advantages of the present invention will be apparent from the following description of preferred embodiments of the invention with reference to the accompanying drawings.

DESCRIPTION OF THE PREFERRED EMBODIMENTS

Now, explanation will be made on the conventional inverter and an embodiment of the inverter in accordance with the present invention, but, for simplification of description all the shown circuits are constituted of only N-channel MOS field effect transistors. However, it will be apparent to persons skilled in the art that the circuits formed of N-channel MOS transistors can be also formed of other types of insulated gate field effect transistors including P-channel MOS transistors.

Figure 1:
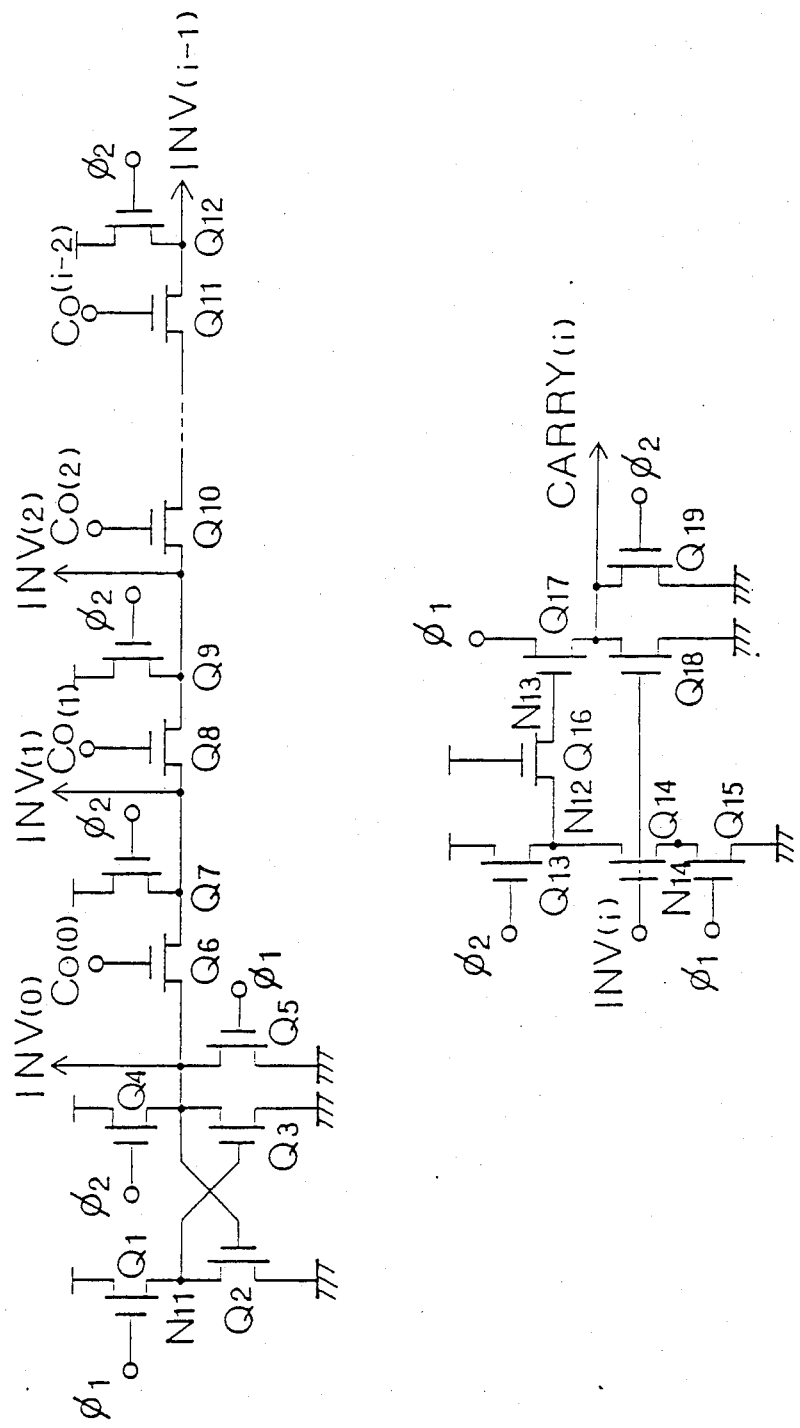
FIG. 1 is a circuit diagram showing a conventional inversion control signal generator.
Figure 2:
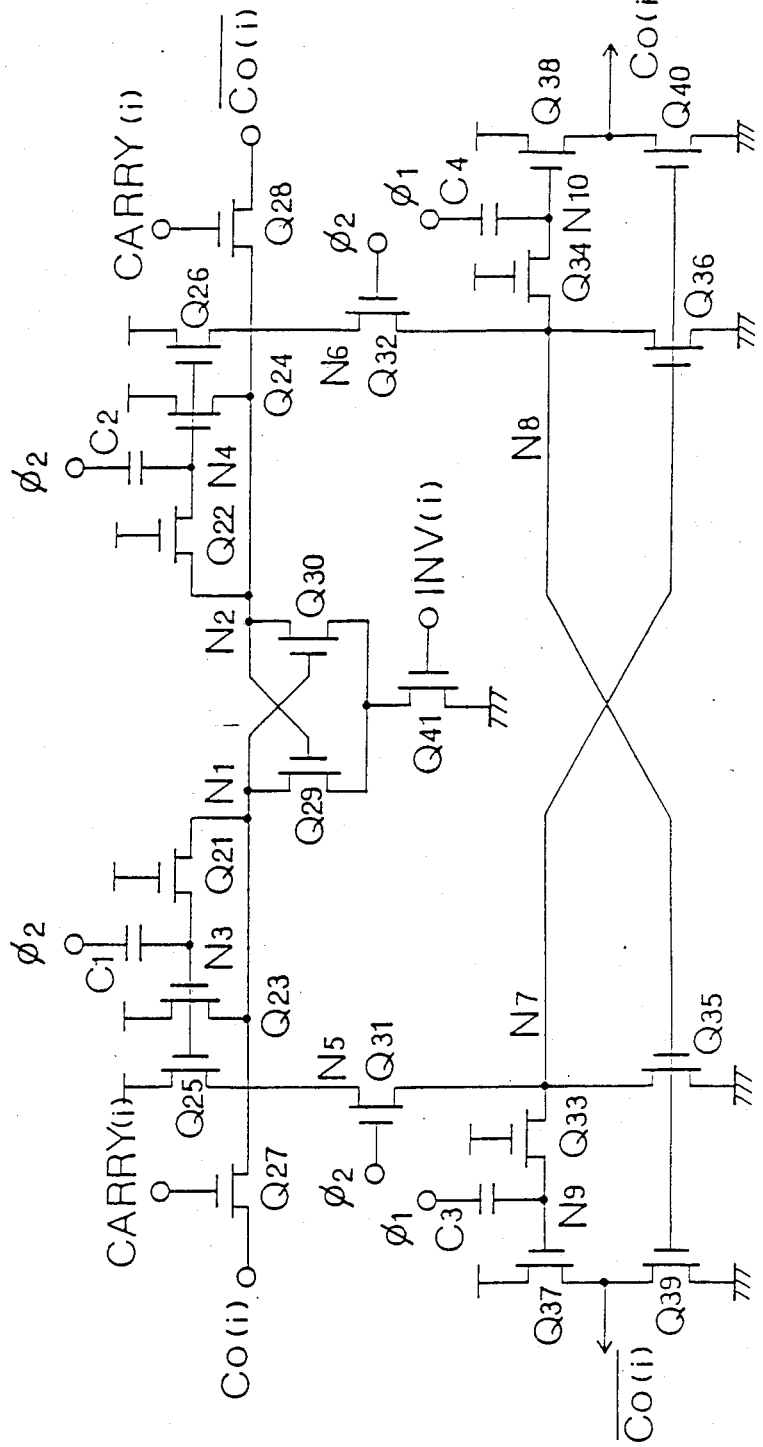
FIG. 2 is a circuit diagram of a conventional inverter combined with the inversion control signal generator shown in FIG. 1 so as to constitute a binary counter.

Referring to FIGS. 1 and 2, there are shown a conventional inversion control signal generator and a conventional inverter which can be coupled to constitute a synchronous binary counter. Namely, the inverter is a flip-flop circuit for generating a binary counter signal Co (i), and the inversion control signal generator produces a carry signal used for inverting the flip-flop circuit. If a number of these circuits are interconnected in a given sequence, a $2^n$ notation synchronous counter can be easily constituted.

Generally speaking, the condition for inversion of (i)th digit data Co (i) in a binary counter is that the (i-1)th digit data and all the least digit data are in the same data condition. In the case of increment counters, the inversion condition is that all the least digits are "1", and in the case of decrement counters, the inversion condition is that all the least digits are "0". In addition, whether or not all the digits are in the same data condition can be easily confirmed by using and AND circuit or a NOR circuit.

Again referring to FIG. 1, the shown circuit comprises an inversion control signal generator including a pair of MOS transistors $Q_2$ and $Q_3$ cross-connected to form a flip-flop. The MOS transistor $Q_2$ is grounded at its source and is connected to a supply voltage through a node $N_{11}$ and a MOS transistor $Q_1$ whose gate is connected to receive a first or activation clock $\phi_1$ of a two-phase clock. The drain of the MOS transistor $Q_3$ is connected to the supply voltage through a MOS transistor $Q_4$ whose gate is adapted to receive a second or precharge clock $\phi_2$ of the two-phase clock. Further, a MOS transistor $Q_5$ is connected in parallel to the MOS transistor $Q_3$, and the second clock $\phi_2$ is applied to the gate of the MOS transistor $Q_5$. As shown in the drawing, to the drain of the MOS transistor $Q_3$ are connected a series of MOS transistors $Q_6$, $Q_8$, $Q_{10}$ ... $Q_{11}$ connected in the named order. Between the supply voltage and one end of each of these MOS transistors $Q_6$, $Q_8$, $Q_{10}$ ... $Q_{11}$, a MOS transistor $Q_7$, $Q_9$, ... or $Q_{12}$ is connected, whose gate is adapted to receive the second clock signal $\phi_2$.

With this arrangement, binary counter signals Co (o), Co (1), Co (2) ... Co (i-2) are respectively applied to the gates of the MOS transistors $Q_6$, $Q_8$, $Q_{10}$ ... $Q_{11}$. An inversion control signal INV (0) is outputted from the connection node between the MOS transistors $Q_3$ and $Q_4$. Also, inversion control signals INV (1), INV (2), ... INV (i-1) are outputted from the connection node between each pair of adjacent MOS transistors $Q_6$ and $Q_8$, $Q_8$ and $Q_{10}$, ... Thus, the flip-flop composed of the MOS transistors $Q_2$ and $Q_3$ is cyclicly inverted by trains of the clocks $\phi_1$ and $\phi_2$. On the other hand, at each of the precharge clocks $\phi_2$, the inversion signal outputs INV (i) are precharged. Therefore, a shift circuit is formed.

Furthermore, the shown circuit includes a carry signal generator provided to each of the inversion signal outputs INV (0) . . . INV (i). This generator includes three MOS transistors $Q_{13}$, $Q_{14}$ and $Q_{15}$ connected in series between the supply voltage and the ground. These transistors receive at their gates a precharge clock $\phi_2$, the inversion signal INV (i) and the activation clock $\phi_1$, respectively. The connection node $N_{12}$ between the MOS transistors $Q_{13}$ and $Q_{14}$ is connected to a gate of a MOS transistor $Q_{17}$ through a transfer MOS transistor $Q_{16}$ ceaselessly maintained in on condition. The MOS transistor $Q_{17}$ is adapted to receive the activation clock $\phi_1$ at its drain, and is grounded through a parallel circuit of MOS transistors $Q_{18}$ and $Q_{19}$. The MOS transistor $Q_{18}$ receives at its gate the inversion signal INV (i), and the MOS transistor $Q_{19}$ receives at its gate the precharge clock $\phi_2$. And, a carry signal CARRY (i) is outputted from the connection node between the MOS transistors $Q_{17}$, $Q_{18}$ and $Q_{19}$.

Next, explanation will be made on operation of the circuit shown in FIG. 1 with reference to FIG. 4. Before the time $t_0$, the counter output Co (i) is low and the inverted counter output $\overline{Co}$ (i) is high. Further, the precharge clock $\phi_2$ is high and the activation clock $\phi_1$ is low.

In this condition, therefore, the transistors $Q_4$, $Q_7$, $Q_9$, $Q_{12}$, $Q_{13}$ and $Q_{19}$ are in on condition, and the transistors $Q_1$, $Q_5$ and $Q_{15}$ are off condition. Thus, all the inversion signal output nodes INV (i) are charged through the transistors $Q_4$, $Q_7$, $Q_9$ and $Q_{12}$ to assume a high level. Further, the node $N_{12}$ is charged through the transistor $Q_{13}$, so that the node $N_{13}$ is put at a high level through the transistor $Q_{16}$ ceaselessly in the on condition, and the node $N_{14}$ is rendered high through the transistor $Q_{14}$ receiving the inversion signal INV (i) at its gate. Therefore, the transistor $Q_{17}$ is put in on condition. On the other hand, since the gates of the transistors $Q_{18}$ and $Q_{19}$ are put at a high level, the signal CARRY (i) is put at a low level.

At the time $t_1$, the clock $\phi_2$ becomes low and the clock $\phi_1$ becomes high. As a result, the transistors $Q_4$, $Q_7$, $Q_9$, $Q_{12}$, $Q_{13}$ and $Q_{19}$ are turned off, and the transistors $Q_1$, $Q_5$ and $Q_{15}$ are turned on. Thus, the flip-flop composed of the transistors $Q_2$ and $Q_3$ is inverted in its condition, so that the node $N_{11}$ is brought into a high level and the output INV (0) is brought into a low level. At this time, however, since all the counter outputs Co (0) . . . Co (i-2) are at a low level, the remaining outputs INV (1) . . . INV (i-1) are maintained at the high level. On the other hand, the CARRY (i) output node is charged through the transistor $Q_{17}$ turned on by the clock $\phi_1$. Therefore, only the CARRY (0) output is brought into a high level, because the associated transistor $Q_{18}$ is turned off by the low level signal INV (0). But, since the other signals INV (i) are at a high level, the other CARRY (i) outputs are grounded through the associated transistor $Q_{18}$, and therefore, are maintained at a low level.

Thus, the signal INV (0) is circulated between the high level and the low level at repeated cycles each of which contains the precharge of the output node INV (i) and the pull-down of the output node INV (i) caused by inversion of the flip-flop consisting of the transistor $Q_2$ and $Q_3$. Each output INV (i) is pulled down and is put in a low level period when all the least digit outputs Co (0) . . . Co (i-1) are high. Thus, signal CARRY (i) are selectively generated at each cycle. For reference, in the case of decrement counters, the outputs Co (i-1) are connected to respective gates.

Turning to FIG. 2, the conventional inverter for use in a binary counter comprises a latch flip-flop for storing an output data of the previous cycle, which includes MOS transistors $Q_{21}$ to $Q_{30}$ and $Q_{41}$ and capacitors $C_1$ and $C_2$ connected as shown in the drawing. The latch flip-flop is connected through a pair of transfer MOS transistors $Q_{31}$ and $Q_{32}$ to an output flip-flop for outputting a pair of counter output signals Co (i) and $\overline{Co}$ (i). The above transfer transistors $Q_{31}$ and $Q_{32}$ are adapted to receive the precharge clock $\phi_2$, and the output flip-flop is constituted of MOS transistors $Q_{33}$ to $Q_{40}$ and capacitors $C_3$ and $C_4$ connected as shown in the drawing.

In this conventional inverter, assume that the input signals Co (i) and $\overline{Co}$ (i) are low and high, respectively in a just previous cycle, and that the signal CARRY (i) is at a high level. In this condition, the transistors $Q_{27}$ and $Q_{28}$ are put in on condition because the gates of these transistors are applied with the high level signal CARRY (i), so that the previous data is transferred through the transistors $Q_{27}$ and $Q_{28}$ to the nodes $N_1$ and $N_2$ are decided.

Figure 4:
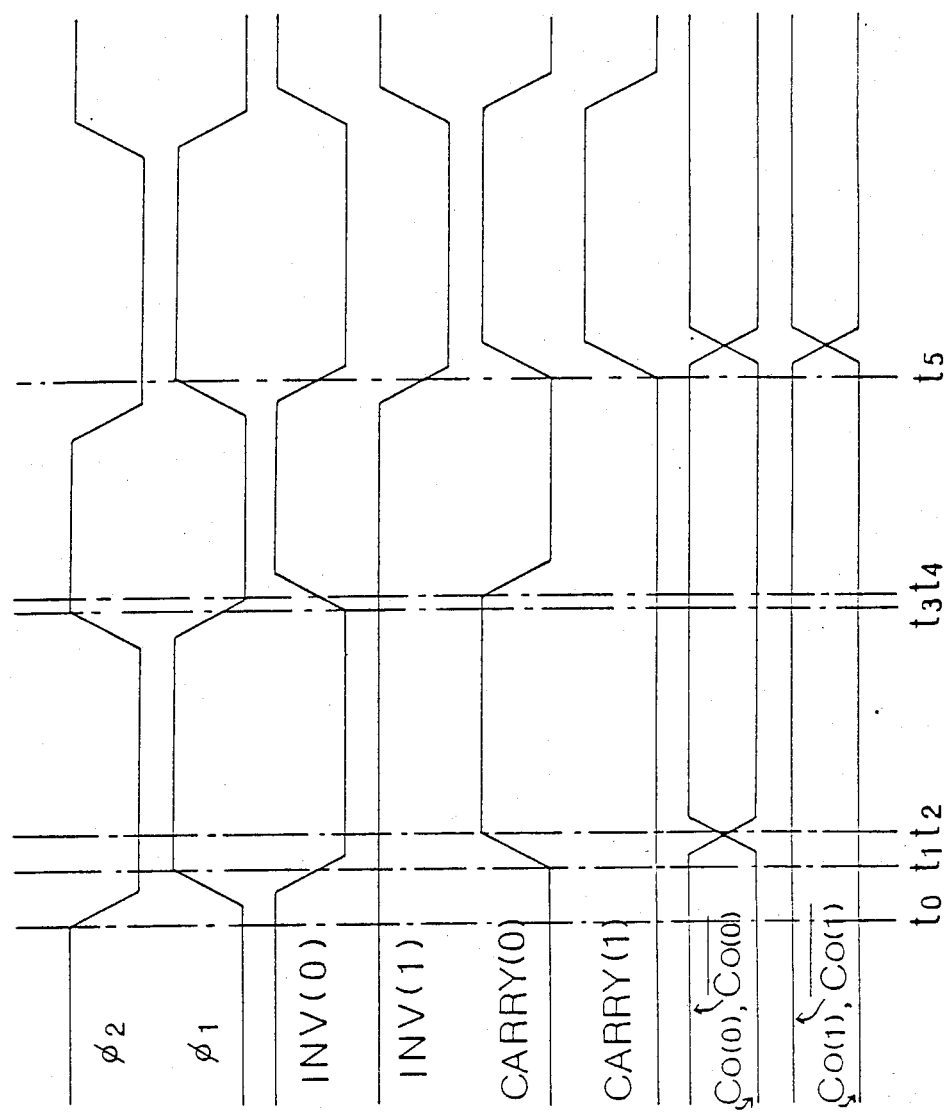
FIG. 4 is a waveform diagram illustrating the conditions of various points in the circuits shown in FIGS. 1 to 3.

In this condition, if the precharge clock $\phi_2$ is brought into a high level at the time $t_3$ as shown in FIG. 4, the transistors $Q_4$ and $Q_{19}$ of the FIG. 1 circuit is turned on, and the signal CARRY (i) is rendered low and the signal INV (i) is rendered high. Further, the transistor $Q_{27}$ and $Q_{28}$ are turned off, so that the inputs Co (i) and $\overline{Co}$ (i) are isolated from the latch flip-flop. But, the transistor $Q_{41}$ is turned on by a high level signal INV (i), so that the flip-flop consisting of the transistors $Q_{29}$ and $Q_{30}$ is activated to emphasize the potential difference between the nodes $N_1$ and $N_2$. Thus, the previous data is retained in this flip-flop.

On the other hand, the condition of the nodes $N_3$ and $N_4$ are respectively determined by the nodes $N_1$ and $N_2$ through the transistors 21 and 22 ceaselessly maintained in on condition. As seen from the above, since the node $N_1$ is low and the node $N_2$ is high, the level of the node $N_4$ is increased through the capacitor $C_2$ because of the level change of the clock $\phi_2$ at the time $t_3$. Thus, the gate level of the transistors $Q_{24}$ and $Q_{26}$ is increased. But, the node $N_3$ is maintained at a low level. Accordingly, the transistors $Q_{21}$ and $Q_{23}$ and the capacitor $C_1$ as well as the transistors $Q_{22}$ and $Q_{24}$ and the capacitor $C_2$ constitute an active pull-up circuit, respectively.

At this situation, the conditions of the nodes $N_7$ and $N_8$ in the output flip-flop are decided through the transistors $Q_{25}$, $Q_{26}$, $Q_{31}$ and $Q_{32}$. Namely, the node $N_8$ is high and the node $N_7$ is low. The levels of the nodes $N_7$ and $N_8$ are respectively transferred to the nodes $N_9$ and $N_{10}$ through the transistors $Q_{33}$ and $Q_{34}$ ceaselessly maintained in on condition. Thus, a high level signal Co (i) and a low level signal $\overline{Co}$ (i) are outputted as the binary counter outputs in this cycle.

At the time $t_5$, if the clock $\phi_2$ is rendered low and clock $\phi_1$ is rendered high, the output flip-flop is isolated from the latch flip-flop. As a result, the level of the node $N_{10}$ is further elevated through the capacitor $C_4$, so that the output Co (i) is pulled up to the supply voltage. Thus, the inversion operation is completed. As seen from the above, the transistor $Q_{33}$ and the capacitor $C_3$ as well as the transistor $Q_{34}$ and the capacitor $C_4$ constitute an active pull-up circuit.

In flip-flops for non-selected bits, since the signal CARRY (i) and the signal INV (i) are low and high, respectively over the whole period of the cycle mentioned above, the previous cycle data is not applied to the latch flip-flop, and therefore, the flip-flop maintains the previous operation data.

As seen from the above, the previous inverter needs the latch flip-flop for storing the previous data, and the pull-up circuits for elevating the levels of various nodes. Therefore, the number of required element is very large. In addition, it is driven by the two-phase clock, the inversion control signal and the carry signal.

Figure 3:
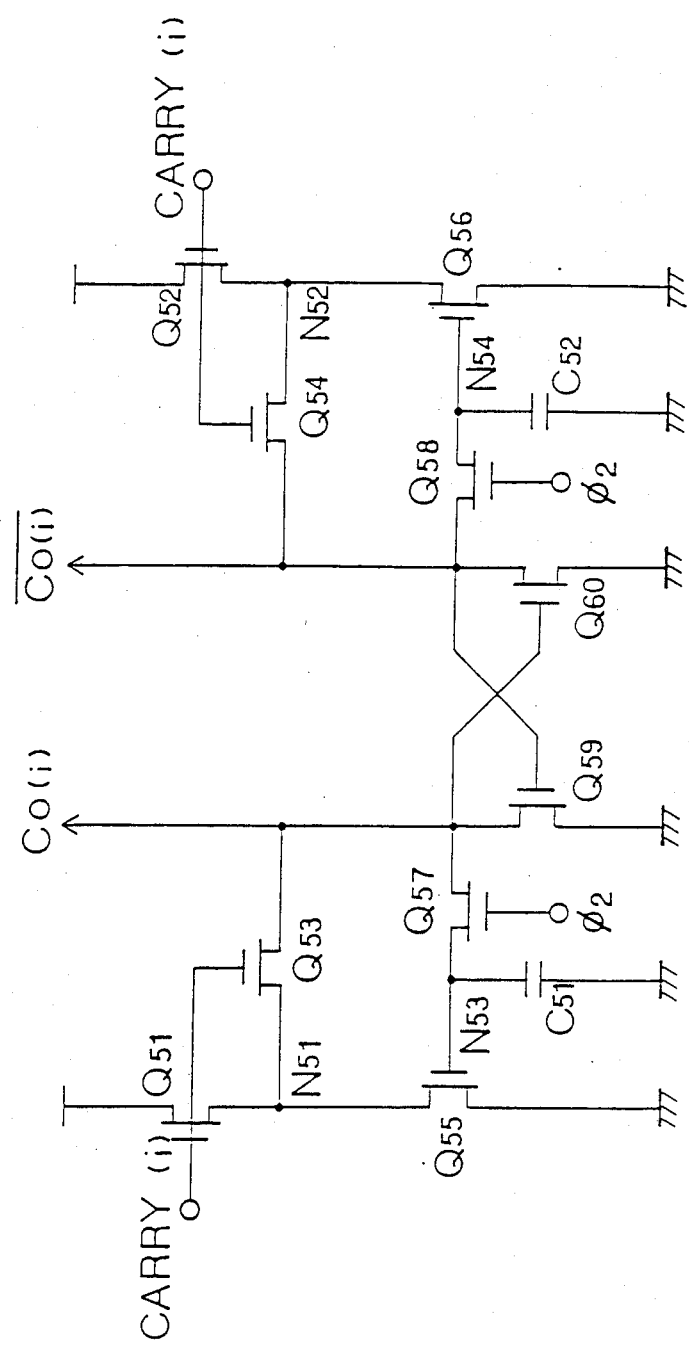
FIG. 3 is a circuit diagram showing one embodiment of an inverter in accordance with the present invention, which can be combined with the inversion control signal generator shown in FIG. 1 so as to form a binary counter.

Referring to FIG. 3, the inverter in accordance with the present invention comprises a pair of MOS transistors $Q_{59}$ and $Q_{60}$ cross-connected to form a flip-flop. The drain of the transistor $Q_{59}$ is adapted to receive and output the signal Co (i) and is connected to a node $N_{53}$ through a transfer MOS transistor $Q_{57}$ whose gate receive the precharge clock $\phi_2$. This node $N_{53}$ is grounded through a capacitor $C_{51}$ and is connected to the gate of a MOS transistor $Q_{55}$ whose source-drain path is connected between a node $N_{51}$ and the ground. The node $N_{51}$ is connected through a MOS transistor $Q_{51}$ to a supply voltage and through another MOS transistor $Q_{53}$ to the drain of the transistor $Q_{59}$ and hence the output node Co (i). These two transistors $Q_{51}$ and $Q_{53}$ are respectively adapted to receive at their gates the signal CARRY (i).

Further, the drain of the transistor $Q_{60}$ is adapted to receive and output the signal $\overline{Co(i)}$ and is connected to a node $N_{54}$ through a transfer MOS transistor $Q_{58}$ whose gate receive the precharge clock $\phi_2$. This node $N_{54}$ is grounded through a capacitor $C_{52}$ and is connected to the gate of a MOS transistor $Q_{56}$ whose source-drain path is connected between a node $N_{52}$ and the ground. The node $N_{52}$ is connected through a MOS transistor $Q_{52}$ to the supply voltage and through another MOS transistor $Q_{54}$ to the drain of the transistor $Q_{60}$ and hence the output node $\overline{Co(i)}$. These two transistors $Q_{52}$ and $Q_{54}$ are also adapted to receive at their gates the signal CARRY (i), respectively.

Now, assume that the signal Co (i) is at a low level and the signal $\overline{Co(i)}$ is at a high level. In this condition, before the time $t_0$ as shown in FIG. 4 in which the clock $\phi_2$ is high, the transistors $Q_{57}$ and $Q_{58}$ are in on condition. Therefore, the node $N_{54}$ is put at a high level and the capacitor $C_{52}$ is charged, so that the transistor $Q_{56}$ is brought into on condition. On the other hand, the node $N_{53}$ is put at low level, and therefore, the capacitor $C_{51}$ is discharged and the transistor $Q_{55}$ is in off condition.

At the time $t_1$, the clock $\phi_2$ is brought into a low level, so that the transistors $Q_{57}$ and $Q_{58}$ are put in off condition. As a result, the nodes $N_{53}$ and $N_{54}$ are isolated from the input/output nodes Co (i) and $\overline{Co(i)}$, respectively.

At the time $t_2$, if a selected CARRY signal generator outputs a high level output signal CARRY (i), the transistors $Q_{51}$, $Q_{52}$, $Q_{53}$ and $Q_{54}$ receiving the high level CARRY signal are turned on. At this time, the transistor $Q_{56}$ is put in on condition by a high level node $N_{54}$ and the transistor $Q_{55}$ is put in off condition by a low level node $N_{53}$. Therefore, the node $N_{51}$ and the input/output node Co (i) are charged through the transistors $Q_{51}$ and $Q_{53}$ so as to assume a high level condition. On the other hand, the node $N_{52}$ is supplied with an electric current through the transistor $Q_{52}$, but the supplied current is grounded through the transistor $Q_{56}$. Further, the charge on the node $\overline{Co(i)}$ is also grounded through the transistors $Q_{53}$ and $Q_{56}$. Namely, the node $\overline{Co(i)}$ is pulled down. As a result, the flip-flop $Q_{59}$-$Q_{60}$ is inverted in its condition, so that the counter output signal Co (i) is brought into a high level and the signal $\overline{Co(i)}$ is brought into a low level.

At the time $t_3$, the clock $\phi_2$ is brought into a high level, and at the time $t_4$, the inversion signal CARRY (0) is rendered low. As a result, the node $N_{53}$ is connected through the transistor $Q_{57}$ to the high level node Co (i). Namely, the node $N_{53}$ is put at a high level and the capacitor $C_{51}$ is charged. On the other hand, the node $N_{54}$ is connected through the transistor $Q_{58}$ to the low level node $\overline{Co(i)}$, and therefore, the capacitor $C_{52}$ is discharged, so that the node $N_{54}$ is at a low level. This condition is maintained until the time $t_5$ in the inverter for Co (0) and $\overline{Co(0)}$ as seen from FIG. 4.

In the course of the above mentioned sequential operation, the inverter assumes the charge inverted condition in opposite to the condition before the time $t_0$. Namely, the inversion operation is completed.

As seen from the above, the outputs of the flip-flop consisting of the transistors $Q_{59}$ and $Q_{60}$ constitute the binary counter outputs Co (i) and $\overline{Co(i)}$. The previous data is stored on the nodes $N_{53}$ and $N_{54}$ through the transistors $Q_{57}$ and $Q_{58}$ during the precharge period, and the high level output node of the flip-flop is pulled down in the succeeding non-precharge period. These operations are controlled by a high level CARRY (i) signal which indicates the selection of the (i)th inverter. Namely, the inverter does not need the inversion control signal INV (i) and the activation clock $\phi_1$ for its operation.

The invention has thus been shown and described with reference to specific embodiments. However, it should be noted that the invention is in no way limited to the details of the illustrated structures but changes and modifications may be made within the scope of the appended claims.

I claim:

1. An inverter for use in a binary counter comprising a flip-flop having first and second input/output nodes respectively applied with input signals of opposite polarities, first switch means connected between the first input/output node and a third node and turned on and off in response to a control clock signal, charge storage means connected to the third node so as to hold the potential on the first input/output node when the first switch means is turned on, and switch circuit means connected between a supply voltage and a ground and having a first input connected to the third node, a second input connected to receive an inversion control signal, and an output connected to the first input/output node, the switch circuit means being responsive to the inversion control signal so as to bring its output to a voltage condition opposite to that held in the charge storage means.

2. An inverter claimed in claim 1 wherein the switch circuit means includes a second switch means connected between the ground and a fourth node and turned on and off in accordance with the potential held in the charge storage means, a third switch means connected between the fourth node and the supply voltage and turned on and off in accordance with the inversion control signal, and a fourth switch means connected between the first input/output node and the fourth node and turned on and off in accordance with the inversion control signal to assume the same condition as that of the third switch means, whereby when the first input/output node is brought into a high potential and the first switch means is turned on, the third node is brought into a high potential so as to turn on the second switch means, with the result that the first input/output node is brought into a low potential when the third and fourth switch means are turned on in response to the inversion control signal.

3. An inverter claimed in claim 1 wherein the charge storage means is a capacitor connected between the third node and the ground.

4. An inverter claimed in claim 3 wherein the switch circuit means includes a second switch means connected between the ground and a fourth node and turned on and off in accordance with the potential held in the charge storage means, a third switch means connected between the fourth node and the supply voltage and turned on and off in accordance with the inversion control signal, and a fourth switch means connected between the first input/output node and the fourth node and turned on and off in accordance with the inverison control signal to assume the same condition as that of the third switch means, whereby when the first input/output node is brought into a high potential and the first switch means is turned on, the third node is brought into a high potential so as to turn on the second switch means, with the result that the first input/output node is brought into a low potential when the third and fourth switch means are turned on in response to the inversion control signal.

5. An inverter claimed in claim 4 wherein the first switch means is a first field effect transistor having a source-drain path connected between the first input/output node and the third node, the gate of the first transistor being connected to receive the control clock signal, wherein the second switch means is a second field effect transistor having a gate connected to the third node and a source-drain path connected between the fourth node and the ground, wherein the third switch means is a third field effect transistor having a gate receiving the inversion control signal and a source-drain path connected between the supply voltage and the fourth node, and the fourth switch means is a fourth field effect transistor having a gate receiving the inversion control signal and a source-drain path connected between the fourth node and the first input/output node.

6. An inverter claimed in claim 1 further including second switch means connected between the second input/output node and a fourth node and turned on and off in response to the control clock signal, second charge storage means connected to the fourth node so as to hold the potential on the second input/output node when the second switch means is turned on, and second switch circuit means connected between the supply voltage and the ground and having a first input connected to the fourth node, a second input connected to receive the inversion control signal, and an output connected to the second input/output node, the second switch circuit means being responsive to the inversion control signal so as to bring its output to a voltage condition opposite to that held in the second charge storage means.

7. An inverter claimed in claim 6 wherein the first charge storage means is a first capacitor connected between the third node and the ground, and the second charge storage means is a second capacitor connected between the fourth node and the ground.

8. An inverter claimed in claim 7 wherein the first switch circuit means includes a third switch means connected between ground and a fifth node and turned on and off in accordance with the potential held in the first capacitor, a fourth switch means connected between the fifth node and the supply voltage and turned on and off in accordance with the inversion control signal, and a fifth switch means connected between the first input/output node and the fifth node and turned on and off in accordance with the inversion control signal to assume the same condition as that of the fourth switch means, wherein the second switch circuit means includes a sixth switch means connected between the ground and a sixth node and turned on and off in accordance with the potential held in the second capacitor, a seventh switch means connected between the sixth node and the supply voltage and turned on and off in accordance with the inversion control signal, and an eighth switch means connected between the second input/output node and the sixth node and turned on and off in accordance with the inversion control signal to assume the same condition as that of the seventh switch means, whereby in the condition that the first and second input/output nodes of the flip-flop are brought into a high potential and a low potential, respectively, when the first and second switch means are turned on in response to a predetermined control clock signal, the third and fourth nodes are brought into high and low potentials, respectively so as to put the third and sixth switch means in on condition and in off condition, respectively, and thereafter, when the fourth, fifth, seventh and eighth switch means are turned on in response to the inversion control signal, the first and second input/output nodes are inverted into a low potential and a high potential, respectively.

9. An inverter claimed in claim 8 wherein the first switch means is a first field effect transistor having a source-drain path connected between the first input/output node and the third node, the gate of the first transistor being connected to receive the control clock signal, wherein the second switch means is a second field effect transistor having a source-drain path connected between the second input/output node and the fourth node, the gate of the first transistor being connected to receive the control clock signal, wherein the third switch means is a third field effect transistor having a gate connected to the third node and a source-drain path connected between the fifth node and the ground, wherein the fourth switch means is a fourth field effect transistor having a gate receiving the inversion control signal and a source-drain path connected between the supply voltage and the fifth node, and the fifth switch means is a fifth field effect transistor having a gate receiving the inversion control signal and a source-drain path connected between the fifth node and the first input/output node, wherein the sixth switch means is a sixth field effect transistor having a gate connected to the fourth node and a source-drain path connected between the sixth node and the ground, wherein the seventh switch mean is a seventh field effect transistor having a gate receiving the inversion control signal and a source-drain path connected between the supply voltage and the sixth node, and the eighth switch means is a eightth field effect transistor having a gate receiving the inversion control signal and a source-drain path connected between the sixth node and the second input/output node.

10. An inverter for use in a binary counter comprising a flip-flop having first and second input/output nodes respectively applied with input signals of opposite polarities, first switch means connected between the first input/output node and a third node and turned on and off in response to a control clock signal, a first capacitor connected to the third node so as to hold the potential on the first input/output node when the first switch means is turned on, second switch means connected between the second input/output node and a fourth node and turned on and off in response to the control clock signal, a second capacitor connected to the fourth node so as to hold the potential on the second input/output node when the second switch means is turned on, a third switch means connected between the ground and a fifth node and turned on and off in accordance with the potential held in the first capacitor, a fourth switch means connected between the fifth node and the supply voltage and turned on and off in accordance with an inversion control signal, and a fifth switch means connected between the first input/output node and the fifth node and turned on and off in accordance with the inversion control signal to assume the same condition as that of the fourth switch means, a sixth switch means connected between the ground and a sixth node and turned on and off in accordance with the potential held in the second capacitor, a seventh switch means connected between the sixth node and the supply voltage and turned on and off in accordance with the inversion control signal, and an eighth switch means connected between the second input/output node and the sixth node and turned on and off in accordance with the inversion control signal to assume the same condition as that of the seventh switch means, whereby in the condition that the first and second input/output nodes of the flip-flop are brought into a high potential and a low potential, respectively, when the first and second switch means are turned on in repsonse to a predetermined control clock signal, the third and fourth nodes are brought into high and low potentials, respectively so as to put the third and sixth switch means in on condition and in off condition, respectively, and thereafter, when the fourth, fifth, seventh and eighth switch means are turned on in response to the inversion control signal, the first and second input/output nodes are inverted into a low potential and a high potential, respectively.

11. An inverter claimed in claim 10 wherein the first switch means is a first field effect transistor having a source-drain path connected between the first input/output node and the third node, the gate of the first transistor being connected to receive the control clock signal, wherein the second switch means is a second field effect transistor having a source-drain path connected between the second input/output node and the fourth node, the gate of the first transistor being connected to receive the control clock signal, wherein the third switch means is a third field effect transistor having a gate connected to the third node and a source-drain path connected between the fifth node and the ground, wherein the fourth switch means is a fourth field effect transistor having a gate receiving the inversion control signal and a source-drain path connected between the supply voltage and the fifth node, and the fifth switch means is a fifth field effect transistor having a gate receiving the inversion control signal and a source-drain path signal connected between the fifth node and the first input/output node, wherein the sixth switch means is a sixth field effect transistor having a gate connected to the fourth node and a source-drain path connected between the sixth node and the ground, wherein the seventh switch mean is a seventh field effect transistor having a gate receiving the inversion control signal and a source-drain path connected between the supply voltage and the sixth node, and the eighth switch means is a eighth field effect transistor having a gate receiving the inversion control signal and a source-drain path connected between the sixth node and the second input/output node.

* * * * *

UNITED STATES PATENT AND TRADEMARK OFFICE
CERTIFICATE OF CORRECTION

PATENT NO. : 4,680,482

DATED : July 14, 1987

INVENTOR(S) : Takashi Obara

It is certified that error appears in the above-identified patent and that said Letters Patent is hereby corrected as shown below:

Col. 6, line 27, after "$N_2$" delete "are decided" and insert therefor
--. Thus, the respective levels on the nodes $N_1$ and $N_2$ are decided.--

Signed and Sealed this

Thirty-first Day of May, 1988

*Attest:*

DONALD J. QUIGG

*Attesting Officer*  *Commissioner of Patents and Trademarks*